United States Patent [19]

Yoda et al.

[11] Patent Number: 4,706,028
[45] Date of Patent: Nov. 10, 1987

[54] NMR IMAGING METHOD

[75] Inventors: Kiyoshi Yoda; Hidenobu Itagaki; Satoshi Fujimura, all of Hyogo, Japan

[73] Assignee: Mitsubishi Denki Kabushiki Kaisha, Tokyo, Japan

[21] Appl. No.: 784,064

[22] Filed: Oct. 4, 1985

[30] Foreign Application Priority Data

Oct. 12, 1984 [JP] Japan .................. 59-214907

[51] Int. Cl.$^4$ .................................. G01R 33/20
[52] U.S. Cl. .......................... 324/309; 324/306
[58] Field of Search ............... 324/309, 306; 128/653

[56] References Cited

U.S. PATENT DOCUMENTS

| 4,318,043 | 3/1982 | Crooks et al. | 324/309 |
| 4,484,138 | 11/1984 | Bottomley et al. | 324/309 X |
| 4,536,712 | 8/1985 | Iwaoka et al. | 324/309 |
| 4,602,641 | 7/1986 | Feinberg | 324/309 X |
| 4,625,170 | 11/1986 | Yamomoto et al. | 324/309 |

FOREIGN PATENT DOCUMENTS 2079946 1/1982 United Kingdom .

OTHER PUBLICATIONS

"Proton NMR Tomography"; *Phillips Technical Review;* vol. 41, 1983/84, No. 3, pp. 73–88; P. R. Locher.
"Data Routing in Quadrature FT-NMR"; *Journal of Magnetic Resonance,* Issue 13, pp. 249–251 (1974); E. O. Steiskal et al.
"A Whole–Body NMR Imaging Machine"; *J. Phys. E: Sci. Instrum.;* vol. 13, 1980, pp. 947–955; J. M. S. Hutchinson et al.
*Shimadzu Review,* pp. 157–158, undated.
"Electromedical", 8413, p. 53; undated but contains the Abstracts of 4 European Patents, 2 of which deal with NMR, EP 103372 and EP 103388, which have been considered only to extent provided by the illustrated Abstracts thereof.

*Primary Examiner*—Tom Noland
*Attorney, Agent, or Firm*—Sughrue, Mion, Zinn, Macpeak & Seas

[57] ABSTRACT

A method of imaging flowing fluids, such as human blood, using nuclear magnetic resonance whereby an image of high resolution is obtained. First, nuclear spin is excited in a given slice plane of a sample disposed in a magnetostatic field. Then, phase disorder in a direction of a first field gradient due to the first step is compensated for and at least one 180° RF pulse is applied. Next, the nuclear spin is again excited in the slice plane, after which at least first, second and third magnetic field gradients are applied to derive an output signal.

5 Claims, 2 Drawing Figures

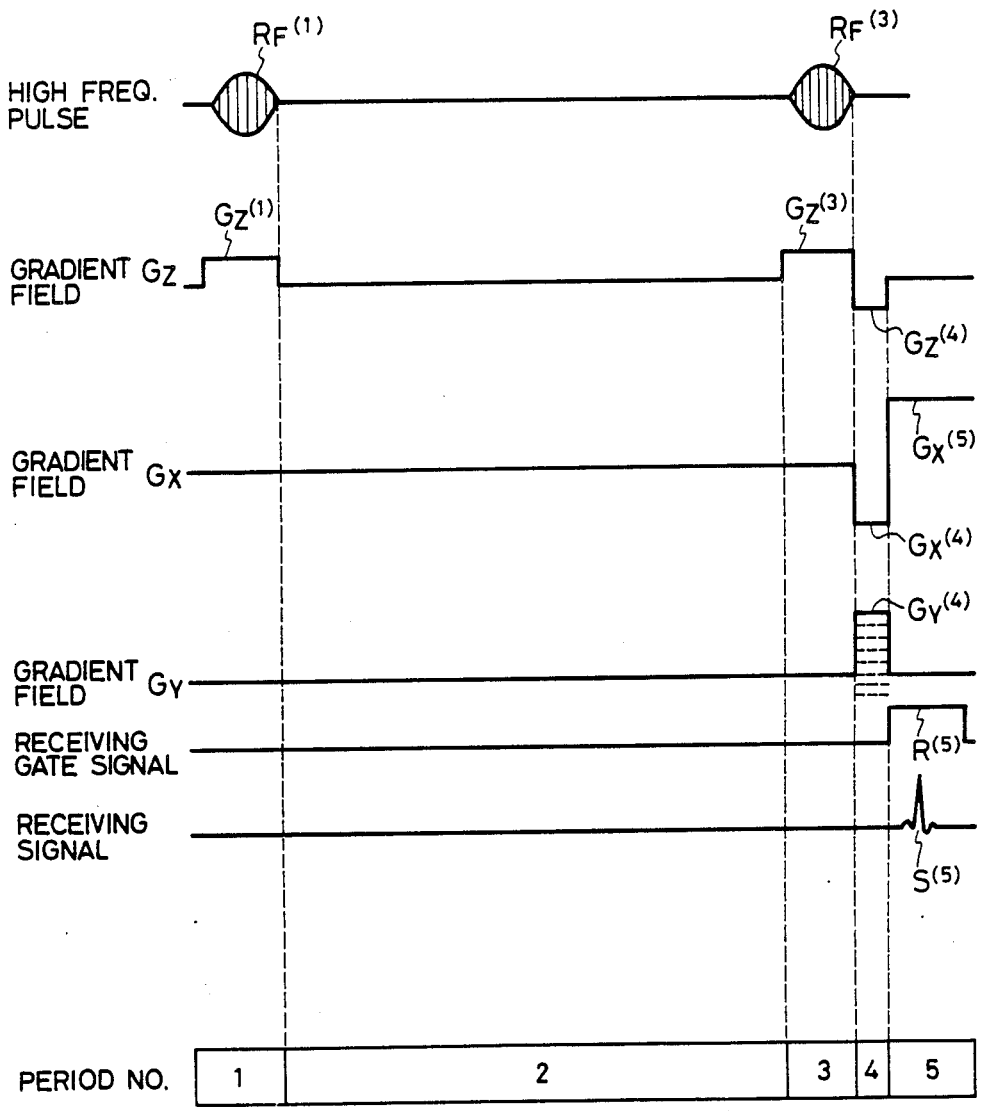

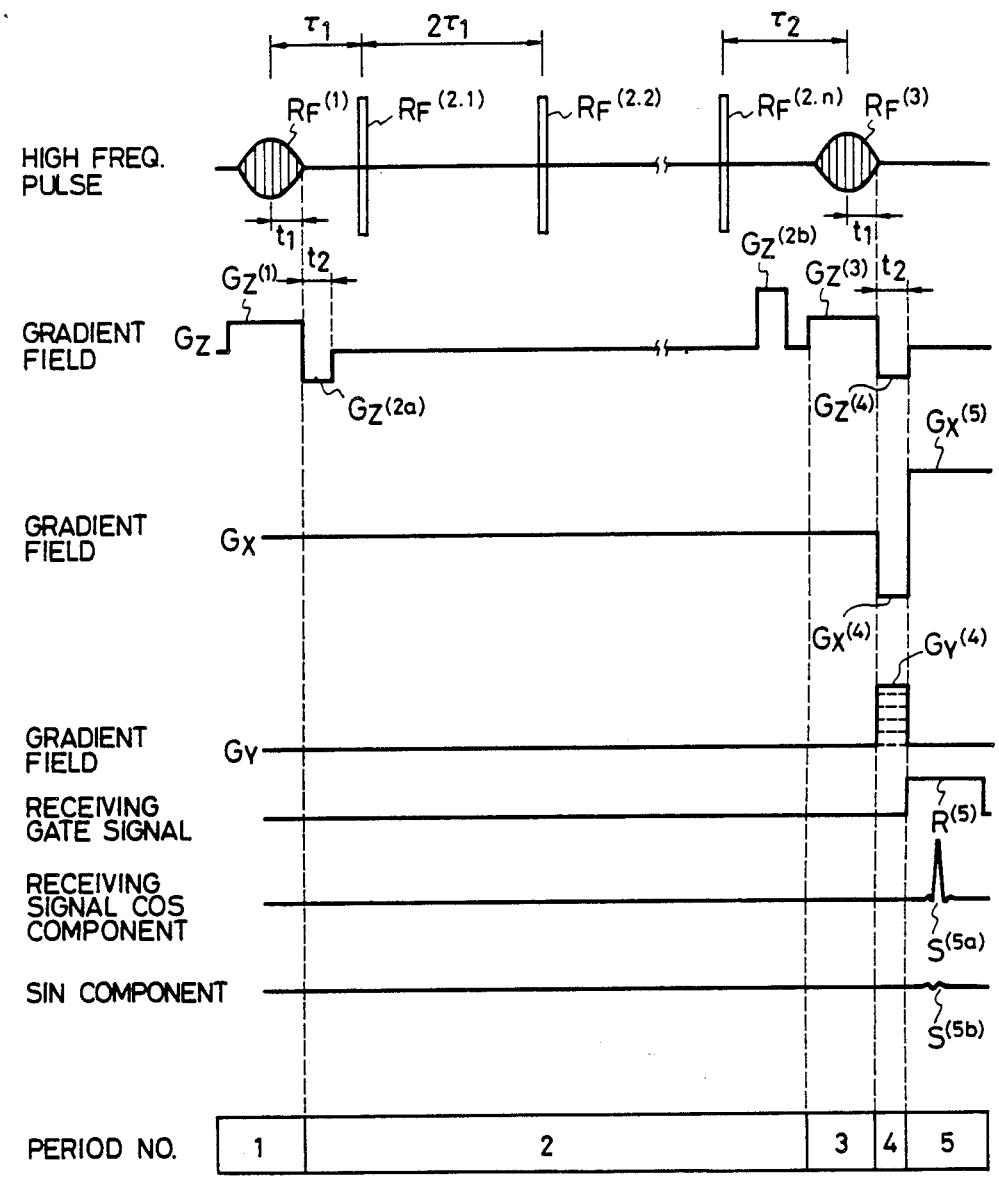

NMR IMAGING METHOD

BACKGROUND OF THE INVENTION

The present invention relates to a method of imaging flowing fluids, such as human blood, using nuclear magnetic resonance (NMR).

An example of a conventional NMR display method includes a sequence whereby first to fifth periods are employed to obtain proton nuclear spins in human blood as blood flow information, as shown in FIG. 1.

In Period No. 1, a high frequency RF magnetic field RF(1), 90° RF pulse, is applied together with a first magnetic field gradient $G_z(1)$ to the sample, with second and third magnetic field gradients $G_x$ and $G_y$ being zero. Upon application of the fields RF(1) and $G_z(1)$ to the sample, nuclear spin in a sample slice having a certain thickness is selectively excited, depending upon the frequency of the RF field RF(1). The thickness of the slice can be varied by changing the bandwidth of the RF pulse or the amplitude of the field gradient $G_z(1)$. The first field gradient $G_z(1)$ has an orientation orthogonal to the slice plane, and the field gradients $G_z$ and $G_x$ are orthogonal to each other.

In Period No. 2, in order to excite nuclear spins coming into the slice plane in the third period, a wait time period is provided in the second period, during which the phase of nuclear spin excited in the first period becomes disordered due to non-uniformity of magnetastatic field.

In Period No. 3, a 90° RF pulse RF(3) is again applied together with the first field gradient $G_z(3)$. In this case, the amplitudes of $G_z(3)$ and $G_z(1)$ are made equal to each other. Further, RF(1) and RF(3) are the same in frequency and bandwidth, and the second and third field gradients are zero. As a result, the nuclear spins of protons in blood flowing into the slice plane during the waiting time period of the second time period and the nuclear spins of protons already existing in the slice and whose magnetization is being recovered are excited.

In Period No. 4, the phase of the spins in the z-direction is ordered by applying the first field gradient $G_z(4)$ and, simultaneously, phase modulation is introduced by applying the third field gradient $G_y(4)$. Upon application of the second field gradient $G_x(4)$, reception of a spin echo signal in a subsequent Period No. 5 is readied.

In Period No. 5, a spin echo S(5) is received under the second field gradient $G_x(5)$ and a receiving gate signal R(5).

In order to constitute an image, the above sequence is repeated with the magnitude of $G_y(4)$ being varied. The image constitution is realized by using the so-called "spin warp" method as disclosed in British Pat. No. 2,079,946.

The signal magnitude of respective image elements is thus in proportion to the amount of blood flowing thereinto and the amount of protons whose magnetization is being recovered.

Therefore, since the signal magnitude of the image thus obtained contains components of protons already existing in the slice plane, it is difficult to display only information concerning the fluid flow. Particularly, in order to obtain information concerning flowing fluid the flow rate of which is low, it is necessary to make the waiting time period, i.e., the interval between two 90° RF pulses, sufficiently long. Since the recovery of magnetization of nuclear spin residing in the slice plane becomes large during that period, the resultant data is not always satisfactory.

SUMMARY OF THE INVENTION

An object of this invention is to provide a NMR imaging method capable of displaying only the flow information.

The above object is achieved, according to the invention, by, firstly, exciting nuclear spin in a slice of a sample disposed in a magnetostatic field, secondly, compensating for phase disorder in a first field gradient direction due to the first step and applying at least one pulsed 180° RF magnetic field, thirdly, exciting again the nuclear spin in the slice plane, and, fourthly, deriving spin echo signals by applying at least the first, second and third field gradients. The second step is used to restrict the recovery of magnetization of spin of protons residing in the slice plane during the waiting time period.

BRIEF DESCRIPTION OF THE DRAWINGS

FIG. 1 shows a pulse sequence of a conventional NMR imaging method; and

FIG. 2 shows a sequence according to an embodiment of the present invention.

DESCRIPTION OF THE PREFERRED EMBODIMENTS

An NMR imaging apparatus to be used for carrying out the present invention may be a conventional apparatus in which a magnetostatic field $H_0$ is applied in, for example, the z-axis direction orthogonal to an arbitrary slice surface of a sample and a high frequency magnetic field pulse is applied in the x- or y-axis direction orthogonal to the z axis. Receiving of the NMR signal may be performed using quadrature detection (QD) for measuring cosine and sine components having a phase differing by 90° (Journal of Magnetic Resonance 13, 249–251 (1974)). The apparatus includes field generating coils for producing magnetic field gradients $G_x$, $G_y$ and $G_z$ in respective x, y and z directions orthogonal to each other, as disclosed in, for example, "Journal of Physics E: Scientific Instruments", vol. 13, pages 947–955.

FIG. 2 shows a measuring sequence according to a preferred embodiments of the present invention.

Magnetic pulses are applied in respective Periods Nos. 1 to 5 as shown in FIG. 1, in which nuclear spin in a certain slice of a sample in a magnetostatic field is excited in Period No. 1 and the excited spin is rephased using 180° out-of-phase pulses to observe spin echo signals in Period No. 2 and subsequent periods.

Period No. 1

This is the same as Period No. 1 of the conventional sequence. That is, a high frequency RF magnetic field RF(1), 90° RF pulse, is applied together with a first magnetic field gradient $G_z(1)$ to the sample, with the second and third magnetic field gradients $G_x$ and $G_y$ being zero. With application of the fields RF(1) and $G_z(1)$ to the sample, nuclear spin in a sample slice having a certain thickness is selectively excited, depending upon the frequency of the RF field RF(1). The thickness of the slice can be varied by changing the bandwidth of the RF pulse or the amplitude of the field gradient $G_z(1)$. The first field gradient $G_z(1)$ has an orientation orthogonal to the slice plane and the field gradients $G_z$, $G_x$ and $G_y$ are orthogonal to each other.

Period No. 2

The first field gradient $G_z(2a)$ is applied to the sample to correct the phase disorder in the x direction of spin excited in the Period No. 1. At this time, it is assumed $$\int_0^{t_1} G_z(1)dt + \int_0^{t_1} G_z(2a)dt = 0,$$

where $t_1$ is a time measured from the time instant at which the amplitude of RF(1) becomes maximum to the time instant at which $G_z$ is inverted.

Then, a rectangular 180° RF pulse RF(2,1) is applied. The interval between RF(1) and RF(2,1) is $\tau_1$ as shown. A 180° RF pulse RF(2,2) is applied after $2\tau_1$ from the 180° RF pulse RF(2,1). Thereafter, a RF pulse RF(2,3) (not shown) is applied after $2\tau_1$ from the RF(2,2). The application of the 180° RF pulse is repeated at interval of $2\tau_1$ until the n-th pulse RF(2,n) occurs when $n \geq 1$.

The value of $2\tau_1$ is made sufficiently small in comparison with the relaxation time (spin-lattice relaxation time) $T_1$, that recovery of magnetization is suppressed until the end of the Period No. 2.

The 180° RF pulses are shifted in phase by 90° from that of the 90° RF pulse RF(1) to avoid the difficulty of suppressing the recovery of magnetization due to incompleteness of the 180° RF pulse.

Then, the field gradient $G_z(2b)$ is applied to disorder the relative phases of the nuclear spins. In this case, the blood flowing in during this period is irradiated with n 180° RF pulses, and hence the spin is alternatively inverted in the z direction.

A 90° RF pulse RF(3) is applied again together with the first gradient field $G_z(3)$ to generate the spin echo signal. At this time, RF(1) and RF(3) are the same in frequency and bandwidth, and the second and third fields $G_x$ and $G_y$ are zero. As a result, the nuclear spins of protons in the blood flowing into the slice plane during the waiting in the Period No. 2 are excited. As to the spin of protons already present in the slice plane, since the recovery of magnetization thereof is suppressed and the phase thereof is disordered due to the application of $G_z(2b)$, substantially only the spins of protons contained in the blood flowing will contribute to the signal during the Period No. 5. In this period, the interval $\tau_2$ between the 180° RF pulse(2,n) and the 90° RF pulse RF(3) is made small in comparison with the spin-lattice relaxation time to suppress the recovery of magnetization.

Period No. 4

This period is the same as the Period No. 4 of the conventional method and $$\int_0^{t_1} G_z(3)dt + \int_0^{t_1} G_z(4)dt = 0,$$

where $t_1$ is a time period measured from the time instant at which the amplitude of RF(3) becomes a maximum to the time instant at which $G_z$ is inverted.

Period No. 5

This period is the same as Period No. 5 of the conventional method, except that since the receiving system is operating according to the QD method, both the cosine component S(5a) and sine components S(5b), are measured. The imaging may be performed by repeating the above-described procedures, for example, 128 or 256 times while changing the amplitude $G_z(4)$, receiving the signals, and displaying them according to the known spin warp method.

Consequently, the signal intensities of the respective picture elements are in proportion to the amount of blood flowing into the slice plane. Namely, they are in proportion to the component in the z direction.

A time $t_D$ of Period No. 2 can be expressed by $t_D \cong t_1 + (n-1)2t_1 + t_2 = (2n-1)t_1 + t_2$. By changing $t_D$, the measuring range of the amount of blood can be varied accordingly. For example, for a low blood flow rate, the signal intensity can be increased by making $t_D$ longer.

Further, it is possible to exclude the influence of the spin of protons which are moving during the signal receiving period by shortening the measuring time of the spin echo signal by making the amplitude of the field gradient $G_x(5)$ larger.

Although the 180° RF pulse is shown as having a rectangular waveform, it is not limited thereto, and a 180° RF pulse having a Gaussian waveform, etc., can be used so long as it is possible to effect the desired spin over a wide range. Further, although the 90° RF pulse is shown as having a Gaussian shape, other waveform shapes are also usable. The phase difference between the 90° RF pulse and the 180° RF pulse is not limited to 90°, and they may be in the same phase.

The phase disorder of nuclear spin in the z direction can be compensated for using a known method such as that described in "Proton NMR Tomography" P. R. Locher, pages 73–88, Philips Technical Rev. 41.

In this embodiment, the flow rate of blood in the z direction is imaged. However, by changing the direction of the gradient field, the distribution of blood flow in an arbitrary direction can be imaged.

Further, although $G_z$ is applied twice as $G_z(2b)$ and $G_z(3)$, they can be combined as a single pulse. Further, instead of applying $G_z(2b)$, it is possible to apply a similar pulse to $G_z(2b)$ in the $G_x$ or $G_y$ direction in the same period, or to combine them suitably. It is of course possible to apply a plurality of pulses during different periods. It may be possible to omit the application of $G_z(2b)$ which disorders the phase of nuclear spin.

The bandwidth of RF(1) need not always be same as that of RF(3), and the amplitude of $G_z(1)$ need not always be the same as that of $G_z(3)$.

Although signal receiving is performed by inverting the gradient field to obtain the spin echo signal and then constituting an image using the spin warp method, which is a Fourier transformation method, other methods, such as receiving free induction signals or reconstruction of the projected image, may be used for this purpose.

In the above-described embodiment, the first, second and third gradient fields are applied to derive the spin echo signal. It is possible to further apply a 180° RF pulse additionally for this purpose.

As mentioned previously, the waveform of the gradient field pulse can be any, provided that it satisfies the described conditions and $G_z(1)$ and $G_z(3)$ during the RF pulse application and $G_x(5)$ during signal receiving are constant.

In order to apply this method to a pulsating blood flow, the above-described sequence should be synchronized with the cardiologic potential.

As described hereinbefore, according to the present invention, a plurality of 180° RF pulses are used to obtain the flow information, by which it is possible to obtain an image with a high resolution.

We claim:

1. An NMR imaging method for imaging flowing fluids comprising:
   a first step of exciting nuclear spin in a given slice plane of a sample disposed in a magnetostatic field;
   a second step of compensating for phase disorder in a direction of a first field gradient due to said first step and then applying at least one 180° RF pulse;
   a third step of exciting again the nuclear spin in said slice plane; and
   a fourth step of applying at least the first, a second and a third field gradients to derive an echo signal.

2. The NMR imaging method as claimed in claim 1, where said first, second and third field gradients are orthogonal to each other.

3. The NMR imaging method as claimed in claim 1, wherein said first and third steps are performed with said first gradient of the magnetic field applied, said first gradient having a gradient direction perpendicular to an arbitrary slice plane of said sample.

4. The NMR imaging method as claimed in claim 1, wherein a time during which said second step is performed is varied to obtain signals from which flow information in a volume in said magnetostatic field is imaged.

5. An NMR imaging method for imaging flowing fluids comprising:
   a first step of exciting nuclear spin in a given slice plane of a sample disposed in a magnetostatic field;
   a second step of compensating for phase disorder in a direction of a first field gradient due to said first step and then applying at least one RF pulse to suppress recovery of magnetization;
   a third step of exciting again the nuclear spin in said slice plane; and
   a fourth step of applying at least the first, a second and a third field gradients to derive an echo signal.

* * * * *